United States Patent [19]

Donaldson

[11] 4,370,515
[45] Jan. 25, 1983

[54] ELECTROMAGNETIC INTERFERENCE

[75] Inventor: Jay W. Donaldson, Cedar Rapids, Iowa

[73] Assignee: Rockwell International Corporation, El Segundo, Calif.

[21] Appl. No.: 280,721

[22] Filed: Jul. 6, 1981

Related U.S. Application Data

[63] Continuation-in-part of Ser. No. 106,600, Dec. 26, 1979, abandoned.

[51] Int. Cl.³ .............................................. H05K 9/00
[52] U.S. Cl. .................................. 174/35 R; 361/424
[58] Field of Search ............ 174/35 MS, 35 R, 35 TS, 174/68.5; 220/3.92, 3.94, 6, 7, 62; 361/424

[56] References Cited

U.S. PATENT DOCUMENTS

| 3,432,061 | 3/1969 | Anderson | 220/7 |
| 3,436,604 | 4/1969 | Hyltin et al. | 357/40 |
| 3,564,114 | 2/1971 | Blinder et al. | 174/68.5 |
| 3,721,746 | 3/1973 | Knappenberger | 174/35 MS |
| 4,218,578 | 8/1980 | Olschewski et al. | 174/35 R |

Primary Examiner—A. T. Grimley
Assistant Examiner—D. A. Tone
Attorney, Agent, or Firm—Edward A. Gerlaugh; Howard R. Greenberg; H. Fredrick Hamann

[57] ABSTRACT

Compartmented EMI shielding structures formed integrally with a printed circuit board having a groundplane element. An elongated strip of metal having means facilitating manual assembly including grooves or channels for controlled bending of the metal is first defined by chemical etching and then formed by bending under finger pressure into wall elements of a compartmented EMI shield.

10 Claims, 15 Drawing Figures

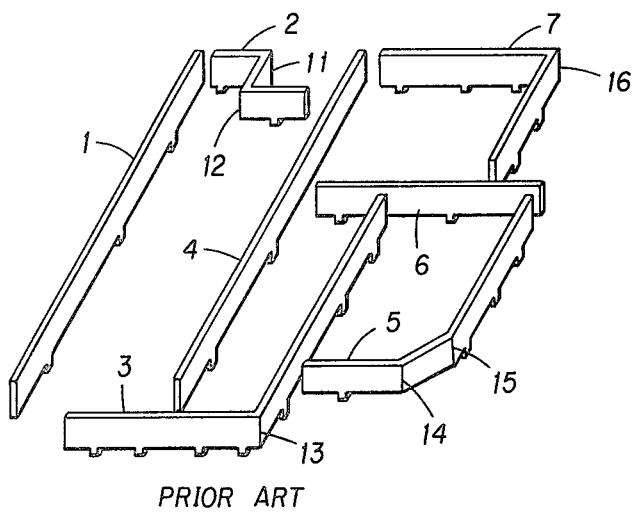
PRIOR ART
FIG 1
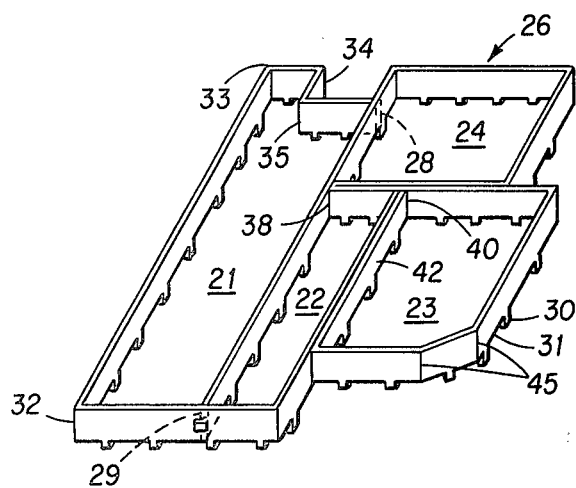
FIG 2
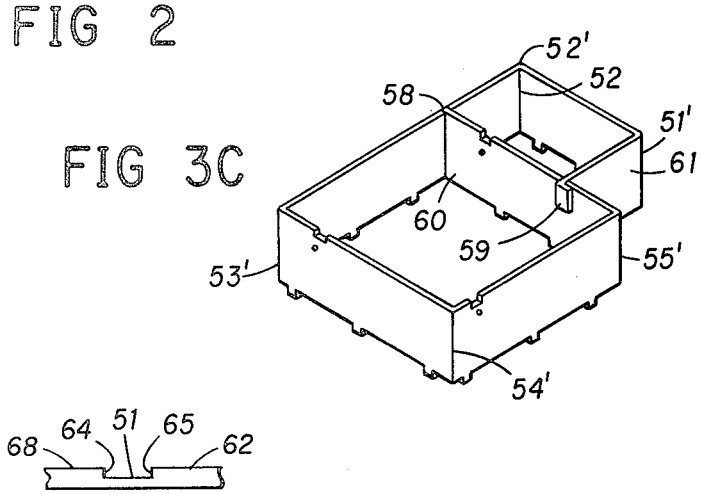
FIG 3C
FIG 4
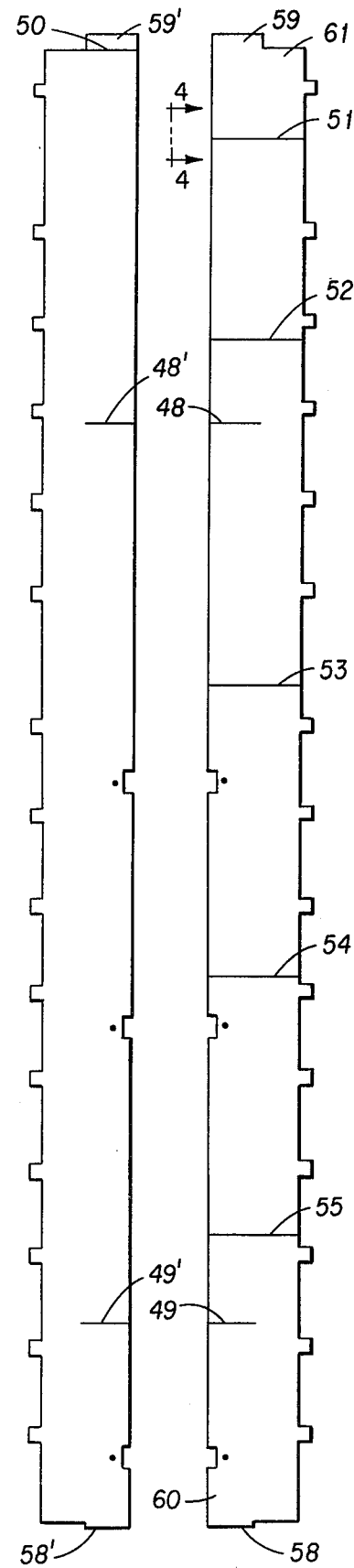
FIG 3B  FIG 3A

ELECTROMAGNETIC INTERFERENCE

CROSS-REFERENCE

This application is a continuation-in-part of my prior copending application Ser. No. 106,600, filed Dec. 26, 1979 now abandoned.

BACKGROUND OF THE INVENTION

This invention relates to anti-inductive structures, and more particularly to electromagnetic interference (EMI) shielding utilized with miniaturized electronic equipment.

The packaging of modern electronic equipment such as radio communications equipment, radar, navigation equipment and the like requires the use of anti-inductive compartments for housing circuits generating radio-frequency energy. Such compartments generally include metallic or metalized walls around the periphery of a circuit emplaced on a planar element such as a printed circuit board. Three common types of EMI shielding structures utilize metal castings, stamped sheet metal, and metalized plastic for the walls. Each of these three types of manufacture requires expensive tooling and labor-intensive construction. The casting process limits minimum wall thickness to about 1.8 millimeters, and requires an expensive mold having a draft or taper therein to facilitate easy removal of the wall element from the mold. EMI shielding stamped from sheet metal requires the use of expensive blanking dies, forming equipment, and an assembly fixture for aligning and soldering together the parts which form the shielding structure. Further, extra process steps are often required to remove burrs from the stamped metal. Metalized plastic structures require relatively thick wall sections compared to stamped sheet metal, and also require an expensive mold for forming the plastic elements. The molded plastic parts must be metalized which requires additional process steps.

EMI shielding structures enclosing a discrete, circuit-bearing substrate such as a printed circuit board inside the structure are known, and are exemplified by U.S. Pat. Nos. 3,721,746 and 4,218,578. Circuit boards having a ground-plane element are known; see, e.g., U.S. Pat. No. 3,564,114. Separate structures for enclosing circuit-bearing substrates to provide EMI shielding therefor are expensive and require labor-intensive construction and assembly.

SUMMARY OF THE INVENTION

The present invention provides an inexpensive solution to the problems of the prior art by providing an EMI shielding structure having walls formed by chemical milling of a continuous elongate strip of thin metal with bend lines etched therein; planar elements of the shielding structure, at least one of which is a ground-plane element of a printed circuit board, are spaced apart by the walls. The elongated strip forming the walls is chemically milled from a metal sheet by two-sided etching. Bend lines or grooves are formed on one side of the strip by selectively deleting etch resistant material from the one side of the strip on which bend lines are formed. The grooves are thus etched to a depth of one-half the thickness of the metal sheet, weakening the metal at the bend lines to facilitate bending with finger pressure. The width of the groove or bend line is predetermined to control the degree of bending of the metal strip. The strip of metal is bent to form the peripheral walls of one or more compartments of the shielding structure; ends of the metal strip may be secured by inserting a tab formed therein into a slot formed in another portion of the metal strip. A plurality of tabs formed along a longitudinal edge of the peripheral walls abutting the printed circuit board are inserted into apertures formed in the circuit board to effect electrical connection between the walls and the ground-plane element. Means for attaching the compartmented walls of the shielding structure to the planar elements are provided.

BRIEF DESCRIPTION OF THE DRAWING

FIG. 1 is a pictorial diagram of a prior art EMI shielding structure, partially exploded.

FIG. 2 is a pictorial diagram of an EMI shielding structure in accordance with the present invention.

FIGS. 3A and 3B show an element of the EMI shielding structure of the present invention.

FIG. 3C shows the element of the FIGS. 3A-B formed into walls of an EMI shielding structure.

FIG. 4 is a side view taken along lines 4—4 of FIG. 3A.

DESCRIPTION OF THE PREFERRED EMBODIMENT

Figure 5:
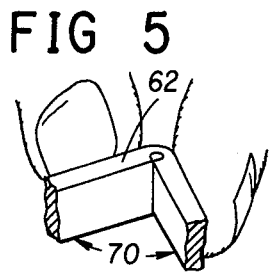
FIGS. 5-9 illustrate various corner configurations of the EMI shielding structure of the present invention.

Referring now to the various views of the drawing for a detailed description of the construction, the advantages, and other features of the invention by characters of reference, FIG. 1 shows a portion of a prior art EMI shielding structure of the type having a plurality of peripheral walls stamped from sheet metal for joining together to form a number of compartments. Sheet metal parts 1-7 forming the walls of the compartments are shown oriented generally as they would be in the completed structure, but slightly separated for convenience of illustrating the plurality of parts. It is evident that several of the parts 2, 3, 5, 6, after stamping, require additional processing to form corners 11-16, as for example, with forming equipment. The additional step of forming corners 11-16 may be eliminated at the expense of providing six additional straight-line parts for assembly. The individual parts shown in FIG. 1 must be arranged in an assembly fixture for joining together as by soldering.

Referring now to FIG. 2, the walls of an EMI shielding structure formed in accordance with the present invention are illustrated. The structure of FIG. 2 comprises four walled compartments 21-24 of various shape and size, all peripherally enclosed by and formed from one continuous strip of metal 26 having ends 28, 29 terminating at corners of the first compartment 21. It is understood that the compartments 21-24, in order to comprise functional EMI shields, must include anti-inductive closures spaced apart by and essentially perpendicular to the illustrated walls; such closures are omitted from FIG. 2 to simplify the description. A plurality of tabs such as the tab 30 project from an edge 31 of the metal strip 26; the tabs 30 are provided for attaching the walls of the shielding structure to a planar circuit element as will be explained hereinafter. The peripheral walls of the compartments 21-24 are formed by bending the strip of metal 26 at predetermined locations such as the right-angled corners 32-35 of the first compartment 21. To facilitate formation of more complex compartment configurations, the metal strip 26 includes 180° bends 38, 40, thus forming walls having double thickness such as the wall 42 between the contiguous compartments 22, 23. The shape of individual compartments may be varied, as for example, by including bends other than right-angled bends, such as the 45° bends 45 of the third compartment 23.

Details of the construction of the peripheral walls of the EMI shielding structure of the present invention are described by referring now to FIGS. 3A-C. FIGS. 3A and 3B are a representation of a photolithographic mask for exposing a layer of etch-resistant material applied to a thin sheet of metal. The lines of FIG. 3A represent areas on one side of a metal sheet where etch-resistant material is removed from the metal prior to etching in accordance with well known photolithographic processes. The lines of FIG. 3B (which is substantially the mirror image of FIG. 3A) represent areas in registration with the lines of FIG. 3A where the etch-resistant material is removed from an opposite side of the same metal sheet. The peripheral lines of FIGS. 3A and 3B thus define the outline of the continuous strip of metal produced by the etching operation. Lines 48, 48',49, 49' defining slots etched in the metal strip are provided, in registration, on both sides FIG. 3A, FIG. 3B of the structure. Bend lines or grooves 50-55 are etched on one side of the strip of metal at locations where the continuous strip is to be bent inwardly on the lines to form corners of the completed EMI shielding structure. Tabs 58, 58',59, 59' are provided at either end 60, 61 of the metal strip for securing the ends, 60, 61 in the corresponding slots 48, 49 of the completed structure. FIG. 3C shows a pictorial view of the walls of an EMI shielding structure having two compartments, which walls are formed from the continuous metal strip of FIGS. 3A, 3B. The shorter tab 58 inserted in the slot 48 prevents lateral movement of the end 60 of the strip. The longer tab 59 inserted in the corresponding slot 49 and bent under finger pressure along the bend line 50 (FIG. 3B) secures the end 61 of the metal strip to the shielding structure. The bend lines 51-55 (FIG. 3A) facilitate bending of the metal strip (FIG. 3A) to form the corresponding corners 51'-55' of the structure of FIG. 3C, the bend lines 51-55 being located interiorly of the corners 51'-55' as shown typically at the corner 52'.

The construction of the present invention utilizes the chemical milling process to form an elongated strip of metal by two-sided etching of a thin sheet of metal. Grooves such as the grooves 50-55 of FIGS. 3A-3B to facilitate bending the elongated strip of metal are etched only on one side of the metal strip; therefore, when the elongated strip is etched from the parent sheet of metal by two-sided etching, the grooves 50-55 are etched to a depth of essentially one-half the thickness of the metal strip. A variety of metals may be utilized for forming the metal strips, including brass, copper, and alloys such as phosphor-bronze and beryllium-copper. Metal of any temper from dead soft to full hard may be used. Currently, production of EMI shielding in accordance with the instant invention utilizes metal sheets from 75 to 890 microns thick having half-hard temper. I have found Cupro Nickel Alloy 725 to be particularly efficacious; the 725 alloy provides excellent ductility, solderability without tin plating, and corrosion resistance.

For a typical structure utilizing 725 alloy sheet 0.254 millimeters thick, the width of a bend line for producing the more common right angled corner was 0.380 millimeters. In another example utilizing one-fourth hard sheet brass 0.405 millimeters thick, the width of the bend line for producing a 90° corner averaged 0.580 millimeters. In yet another test sample group of one-fourth hard sheet brass 0.508 millimeters thick, the groove width producing a 90° bend was 0.686 millimeters. Use of the chemical milling process is particularly advantageous when the parts require plating. For example, brass EMI shielding is tin plated to allow soldering. A large sheet of thin metal chemically milled to produce a plurality of elongated strips for forming EMI shielding structures can be plated in one operation. The prior art construction using metal stampings required separate handling and plating of each stamped part.

Figure 6:
Figure 7:
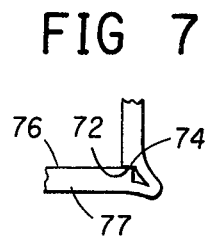

An important feature of the present invention involves controlling the degree of bending under finger pressure of the elongated metal strip. Referring to FIG. 4, a side view, greatly enlarged, of the bend line 51 in the metal strip 62 of FIG. 3A is shown, after etching and removal of the etch-resistant material from the metal strip. The groove 51 having edges 64, 65 is etched to a depth of essentially one-half the thickness of the metal strip. The predetermined width of the groove 51 between the edges 64, 65 determines the degree of bending of the metal strip. I have determined that a groove width from 1.35 to 1.6 times the thickness of the strip of metal produces a right-angled corner as illustrated in FIGS. 5-7. In determining the width of the groove, allowances are made for the thickness of material deposited as by plating on the metal strip. It appears from test data that as the thickness of the metal sheet increases, the ratio of groove width to metal thickness decreases. It is believed that this is the result of the thicker, more rigid metal being subjected to greater bending forces under finger pressure to distort or stretch the metal remaining at the groove (51, FIG. 4). Similarly, when bending thinner metals under finger pressure, the natural response of the assembler to the tactual stimulus of the metal bending at the grooves is to prevent the bending at locations other than the grooves of the more easily bent metal by applying less pressure; thus, the metal in the grooves is subject to less distortion and consequently must be proportionately wider to produce the same degree of bending as the thicker metals.

The term "edge" for the purpose of determining the width of a groove such as the groove 51 is defined herein as a line where the groove intersects with a surface 68 of the metal strip. For the purpose of describing and defining areas of abutment of the metal strip involving the edges 64, 65 thereof, the term "edge" is defined as including the metal surfaces both inside the groove and on the surface 68 immediately adjacent the line of intersection. As shown in FIG. 5, the bend angle 70 is limited under finger pressure to essentially 90° by mutual contact or abutment between the edges, 64, 65. The thickness of the metal strip 62 is greatly exaggerated in FIG. 5 for clarity of illustration. Two modes of resistance to bending under finger pressure have been observed as shown in more detail in FIGS. 6 and 7. FIG. 6 illustrates abutment of the edges 64, 65 (FIG. 4) along a line 71 common to both edges essentially without overlap or contact with metal areas immediately adjacent the intersecting lines of the edges. FIG. 7 (exaggerated for clarity) illustrates the mode wherein one side 72 of the groove abuts the edge 74 and rests on the surface 76 of the metal strip 77 immediately adjacent the edge 74. The width of the groove within the stated range which produces a right-angled corner is predetermined empirically and is dependent on the ductility and temper of the metal used.

Figure 8:
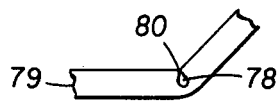

FIG. 8 illustrates a half right-angled corner which is achieved by forming a groove 78 having a width (prior to bending) from 1.15 to one times the thickness of the metal strip 79, the degree of bending thereby being limited to essentially 45°, when the edges 80 of the groove abut each other.

Figure 9:
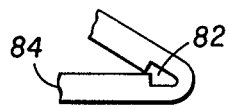

FIG. 9 illustrates an acute-angled corner wherein the predetermined width of the etched groove 82 is greater than 1.35 times the thickness of the metal strip 84. A 180° bend, wherein the edges of the groove are folded inwardly toward each other, may be achieved by providing a groove having a width slightly greater than two times the thickness of the metal strip for thicker metals which remain relatively rigid under finger pressure, and up to three times the thickness of the metal strip for thinner metals which bend relatively easily under finger pressure. Alternatively, a 180° bend may be achieved with a groove of minimal width, e.g. one-half the thickness of the metal strip, by folding the strip of metal with a groove oriented outside of the fold.

Figure 10:
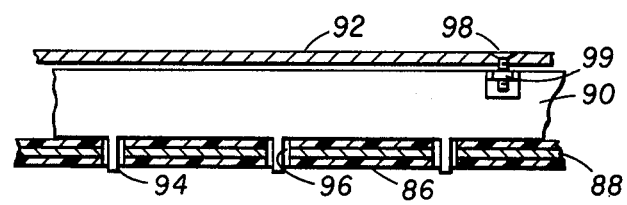
FIG. 10 is a fragmentary side elevation, partially in section, of an RFI shielding structure in accordance with the instant invention.

Referring now to FIG. 10, an enclosed EMI shielding structure is shown comprising a first planar element 86 such as a printed circuit board including a ground-plane element 88 wherein the ground-plane element 88 is utilized as part of the anti-inductive structure. The planar element 86 may be a circuit bearing element of the type including components or circuits (not shown) mounted thereon and interconnected to form an electronic circuit generating radio-frequency energy. Compartment walls 90 (only a fragment of which are shown) made as described herein with reference to FIGS. 2-9 are interposed in the intermediate space between the first planar element 86 and a second planar element 92 which may be, for example, a thin sheet of metal. Tabs such as the tab 94 are formed at intervals along an edge of the walls 90 for insertion into apertures 96 of the printed circuit board 86. The walls 90 may thus be connected mechanically and electrically to the printed circuit board 86, as for example, by wave soldering or by press fitting the tabs into the apertures 96, which may be plated-through holes. The second planar element 92 is attached to the wall structure 90 by a threaded fastener 98 engaging a nut, the latter being attached to the wall 90 by soldering or spot-welding a nut plate thereto. Alternate attachment means (not shown) such as spring clips provided separately or formed integrally with the planar element 92 or the walls 90, may be utilized. The second planar element 92 may be formed unitarily with the wall structure 90 from the same sheet of metal, a bend line or groove being provided therein to facilitate bending the planar element into perpendicular relationship with the wall structure.

Figure 11:
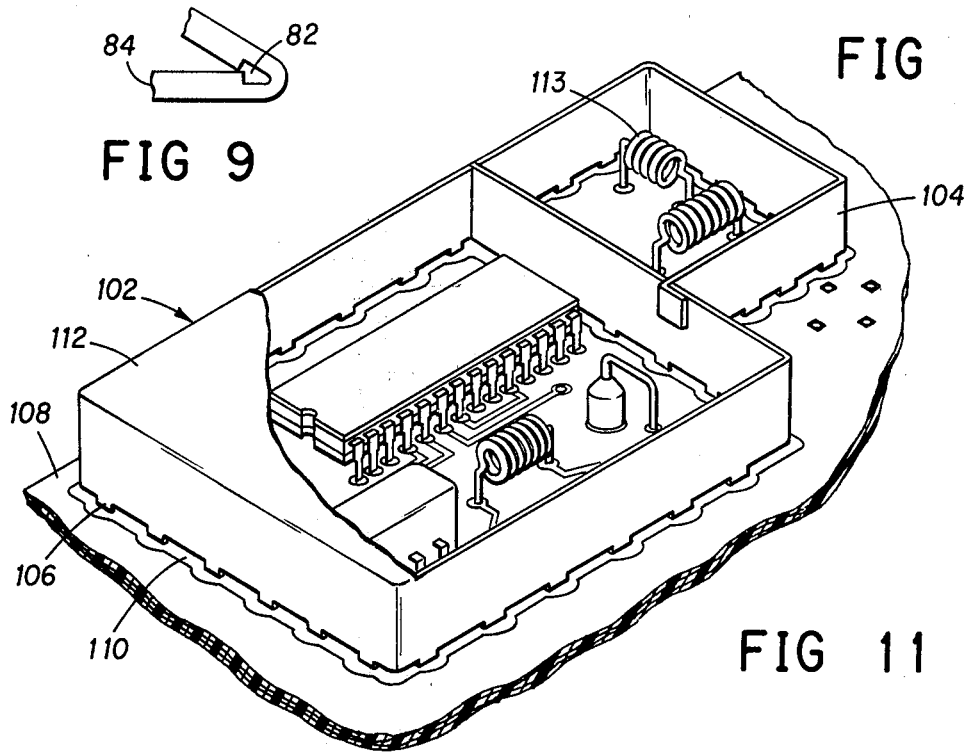
FIG. 11 is a perspective view of an RFI shielding structure in accordance with the invention.
Figure 12:
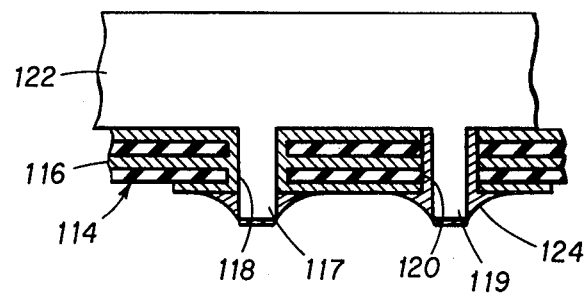
FIG. 12 is an enlarged fragmentary side elevation, partially in section, of the RFI shielding structure in accordance with my invention.

FIG. 11 shows an EMI shielding structure 102 having peripheral walls of sheet metal with tabs 106 extending into apertures of a printed circuit board 108. The tabs 106 (FIG. 11) are electrically connected to a ground-plane circuit element (not shown) of the printed circuit board 108. The ground-plane circuit may be externally exposed in areas 110 of the printed circuit board 108 abutting the peripheral walls 104. A planar element 112 which covers the two enclosures formed by the peripheral walls 104 may be made unitarily from the same sheet of metal as the walls 104 or separately as shown in FIG. 10. Discrete circuit elements generating electromagnetic energy such as the coil 113 mounted on the circuit board 108 inside the peripheral walls 104 are enclosed by EMI shielding structure comprising the peripheral walls 104, the cover 112 and the ground-plane circuit element of the printed circuit board 108. FIG. 12 shows a printed circuit board 114 having a ground-plane circuit 116 electrically connected to tabs 117, 119 extending from a peripheral wall 122 of an EMI shielding structure, through corresponding apertures 118, 120 of the board 114. The first aperture 118 is shown as a plated through hole; the other aperture 120, as a drilled hole without internal plating. Either kind of hole may be utilized for effecting electrical connections between the tabs 117, 119 and the ground-plane circuit 116 with solder 124. The solder 124 is applied most conveniently by wave soldering at the same time discrete components are soldered in the circuit board. It is to be understood that the representations of printed circuit boards in the various views of the drawing are not to scale and that all elements or layers of the boards such as interconnecting circuit layers are not depicted. The thickness of the layers is exaggerated for illustration purposes. Likewise, it is to be understood that the term printed circuit board as utilized herein is not limited to so-called multilayer structures having a plurality of circuit layers, one of which is a ground-plane circuit layer; the present invention may be implemented as well utilizing a single insulating panel having interconnecting circuit runs on one side and a ground-plane circuit on the other.

Figure 13:
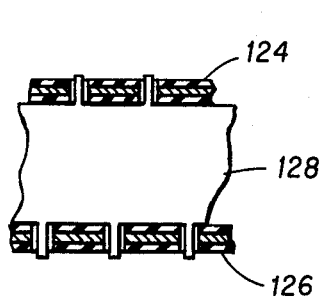
FIG. 13 is a fragmentary side elevation, partially in section, of an RFI shielding structure in accordance with the invention.

FIG. 13 shows another embodiment of the invention wherein printed circuit boards 124, 126 may be stacked in parallel and spaced apart by the peripheral walls 128 of the shielding structure.

I have described above a simple, accurate and inexpensive construction of EMI shielding structures. Many modifications and variations of my invention are possible in light of the above teachings; the appended claims are intended to cover and embrace any such modifications of the invention which fall within the true spirit and scope of the invention.

What is claimed is:

1. An electromagnetic interference (EMI) shielding structure, comprising: first and second planar elements, at least one of the planar elements comprising a ground-plane circuit of a printed circuit board, the printed circuit board having a plurality of apertures therein and an electronic circuit thereon; walls intermediate the planar elements, the walls including a plurality of tabs projecting from a longitudinal edge of the walls, each of the tabs extending into a corresponding one of the plurality of apertures of the printed circuit board and connected electrically to the ground-plane circuit, the planar elements being spaced apart by the walls, and means for attaching the walls to the planar elements, the EMI shielding structure defining an enclosure bound peripherally by the walls and the planar elements including at least a portion of the ground-plane circuit, the electronic circuit being electromagnetically isolated inside the enclosure, the walls being formed of a continuous strip of metal having a corner formed therein by manually bending the strip of metal, the corner including a groove across the strip of metal on one side thereof interiorly of the corner to facilitate the bending, the groove having a depth essentially half the thickness of the strip of metal and a width which predetermines the degree of bending of the metal strip, the groove including first and second edges where the groove intersects the one side, the edges abutting each other to limit the degree of bending of the strip of metal.

2. The EMI shielding structure as claimed in claim 1, wherein the corner formed in the walls of the shielding structure is a right-angled corner, the width of the groove of the right-angled corner prior to bending the strip of metal being from 1.35 to 1.6 times the thickness of the strip of metal, whereby upon bending the strip of metal inwardly on the groove under finger pressure, the edges of the groove bear upon each other preventing the strip of metal bending more than essentially 90°.

3. The EMI shielding structure as claimed in claim 1, wherein the corner formed in the walls of the shielding structure is a half right-angled corner, the width of the groove of the half right-angled corner prior to bending the strip of metal being from 1.18 to 1 times the thickness of the strip of metal, whereby upon bending the strip of metal inwardly on the groove under finger pressure, the edges of the groove bear upon each other preventing the strip of metal bending more than essentially 45°.

4. The EMI shielding structure as claimed in claim 1, wherein the corner formed in the walls of the shielding structure is an acute-angled corner, the width of the groove of the acute-angled corner prior to bending the strip of metal being from 1.4 to 3 times the thickness of the strip of metal, whereby upon bending the strip of metal inwardly on the groove under finger pressure, the edges of the groove bear upon each other preventing the strip of metal bending further when the strip of metal forms the acute-angled corner.

5. An electromagnetic interference (EMI) shielding structure, comprising: first and second planar elements, at least one of the planar elements comprising a ground plane circuit of a printed circuit board, the printed circuit board having a plurality of apertures therethrough and an electronic circuit thereon; walls intermediate the planar elements, the walls including a plurality of tabs coplanar with the walls and projecting from a longitudinal edge of the walls, each of the tabs extending through a corresponding one of the plurality of apertures of the printed circuit board and connected electrically to the ground plane circuit, the planar elements being spaced apart by the walls; and means for attaching the walls to the planar elements, the EMI shielding structure defining an enclosure bound peripherally by the walls and the planar elements including at least a portion of the ground-plane circuit, the electronic circuit being electromagnetically isolated inside the enclosure, the walls being formed of a continuous strip of metal having corners formed therein by manually bending the strip of metal, each of the corners including a groove across the strip of metal on one side thereof interiorly of the corner to facilitate the bending, the groove having a depth essentially half the thickness of the strip of metal, the strip of metal including first and second edges where the groove intersects the one side of the strip of metal, each of the first and second edges upon bending the strip of metal at the groove contacting the other first and second edge, whereby the width of the groove prior to bending the strip of metal determines the degree of bending under finger pressure of the strip of metal.

6. An electromagnetic interference (EMI) shielding structure, comprising: first and second planar elements, at least one of the planar elements comprising a ground-plane circuit of a printed circuit board, the printed circuit board having a plurality of electronic circuits thereon; walls intermediate the planar elements, the walls including a plurality of tabs coplanar with the walls and projecting from a longitudinal edge of the walls, each of the tabs extending through a corresponding one of the plurality of apertures of the printed circuit board and connected electrically to the ground-plane circuit, the planar elements being spaced apart by the walls; and means for attaching the walls to the planar elements, the EMI shielding structure defining a plurality of enclosures each bound peripherally by the walls and the planar elements including a portion of the ground-plane circuit, each of the plurality of electronic circuits being electromagnetically isolated inside one of the enclosures, each of the enclosures having at least a portion of one of the walls thereof in common with a contiguous one of the enclosures, the walls of the EMI shielding structure being formed of an elongate strip of metal having corners formed therein by manually bending the strip of metal, each of the corners including a groove across the strip of metal on one side thereof interiorly of the corner to facilitate the bending, the groove having a depth essentially half the thickness of the strip of metal, the strip of metal including first and second edges where the groove intersects the one side of the strip of metal, each of the first and second edges upon bending the strip of metal at the groove contacting the other first and second edge, whereby the width of the groove prior to bending the strip of metal determines and limits the degree of bending of the strip of metal.

7. An EMI shielding structure as claimed in claim 6, wherein the wall in common includes a double thickness of the strip of metal, the strip of metal being bent back on itself at a 180° corner, the width of the groove of the 180° corner prior to bending the strip of metal being more than 2 times the thickness of the strip of metal.

8. An electromagnetic interference (EMI) shielding enclosure, comprising: a ground-plane circuit element of a first printed circuit board; peripheral walls essentially perpendicular with the first printed circuit board; and a planar element spaced apart from the first printed circuit board by the walls, the first printed circuit board bearing an electronic circuit thereon interiorly of the enclosure, the electronic circuit being electromagnetically isolated within the enclosure, the first printed circuit board including a plurality of apertures therein, the walls including a plurality of first tabs each corresponding in location with one of the plurality of apertures, the tabs extending into the apertures and electrically connected to the ground-plane circuit element, the walls of the enclosure being formed of an elongate sheet of metal having a corner formed therein by manually bending the sheet of metal, the corner including a groove across the sheet of metal on one side thereof interiorly of the corner to facilitate the bending, the groove having a depth essentially half the thickness of the sheet of metal, the sheet of metal including first and second edges where the groove intersects the one side of the sheet of metal, each of the edges upon bending the sheet of metal at the groove contacting the other edge, whereby the width of the groove prior to bending the sheet of metal determines the degree of bending of the sheet of metal.

9. The EMI shielding enclosure as claimed in claim 8, wherein the planar element is formed from the same sheet of metal as the peripheral walls, the other planar element and one of walls being connected at a common bend line etched in the sheet of metal at one side thereof interiorly of the enclosure, the bend line having a depth essentially half the thickness of the sheet of metal, the sheet of metal including third and fourth edges where the bend line abuts the one side of the sheet of metal, each of the third and fourth edges upon bending the sheet of metal under finger pressure at the bend line abutting the other one of the third and fourth edges, whereby the width of the bend line prior to bending the sheet of metal predetermines the maximum degree of bending of the planar element with respect to the one wall.

10. The EMI shielding enclosure as claimed in claim 8, wherein the planar element comprises a second ground-plane circuit element of another printed circuit board, the other printed circuit board having a plurality of holes therein, the walls including a plurality of second tabs each corresponding in location with one of the plurality of holes, the second tabs extending into the plurality of holes and electrically connected to the second ground-plane circuit element.

* * * * *

UNITED STATES PATENT AND TRADEMARK OFFICE
CERTIFICATE OF CORRECTION

PATENT NO. : 4,370,515

DATED : January 25, 1983

INVENTOR(S) : Jay W. Donaldson

It is certified that error appears in the above–identified patent and that said Letters Patent are hereby corrected as shown below:

The title of the invention [54] "ELECTROMAGNETIC INTERFERENCE" should read -- ELECTROMAGNETIC INTERFERENCE SHIELDING STRUCTURE--.

Column 1, line 1, the title of the invention "ELECTROMAGNETIC INTERFERENCE" should read -- ELECTROMAGNETIC INTERFERENCE SHIELDING STRUCTURE--.

Signed and Sealed this

Twenty-ninth Day of March 1983

[SEAL]

Attest:

GERALD J. MOSSINGHOFF

Attesting Officer  Commissioner of Patents and Trademarks